(12) United States Patent
Dissey

(10) Patent No.: US 6,444,973 B1
(45) Date of Patent: Sep. 3, 2002

(54) METHOD AND APPARATUS FOR IMPROVING THE ACCURACY OF A REGION-BASED LIGHT DETECTOR

(76) Inventor: James R. Dissey, 10 Summer Walk Cir., Oak Ridge, NJ (US) 07438

(*) Notice: Subject to any disclaimer, the term of this patent is extended or adjusted under 35 U.S.C. 154(b) by 0 days.

(21) Appl. No.: 09/481,025

(22) Filed: Jan. 11, 2000

Related U.S. Application Data

(60) Provisional application No. 60/115,575, filed on Jan. 12, 1999.

(51) Int. Cl.[7] ............................................. H01J 40/14
(52) U.S. Cl. ...................................... 250/221; 250/205
(58) Field of Search ............................. 250/221, 201.5, 250/205; 356/375, 373

(56) References Cited

U.S. PATENT DOCUMENTS 4,600,305 A * 7/1986 Priddy ........................ 356/152
5,694,153 A * 12/1997 Aoyagi et al. .............. 345/161

* cited by examiner

*Primary Examiner*—Que T. Le
(74) *Attorney, Agent, or Firm*—Moser, Patterson & Sheridan, LLP; Kin-Wah Tong, Esq.

(57) ABSTRACT

A detection apparatus and method for detecting the direction to a light source. The detection apparatus comprises a strobe lamp for emitting a high intensity beam of light and a region-based detector, e.g., a quadrant light detector, for receiving a portion of the high intensity beam of light. In employing a strobe lamp, the overall accuracy and range of the detection apparatus are improved.

20 Claims, 8 Drawing Sheets

METHOD AND APPARATUS FOR IMPROVING THE ACCURACY OF A REGION-BASED LIGHT DETECTOR

This application claims the benefit of U.S. Provisional Application No. 60/115,575 filed on Jan. 12, 1999, which is herein incorporated by reference.

The invention relates to a region based-light detector system, and, more particularly, the invention relates to a method and apparatus for improving the accuracy of a region-based light detector by incorporating a strobe lamp as a light source.

BACKGROUND OF THE DISCLOSURE

Various position detectors are known in the prior art for detecting and measuring light as a means for determining position of a light source or an object disposed between the light source and the position detectors. For example, a method of measuring the direction to a light source utilizing a "Quadrant Light Detector" (or region-based detector) is known. One kind of Quadrant Light Detector is a "Quad Hemispherical Detector" (QHD) that employs a series of reflective cavities and a mask, as disclosed by Ramer et al. in U.S. Pat. No. 5,705,804, herein incorporated in its entirety by reference. A second type of Quadrant Light Detector utilizes a circular mask spaced above a larger circular detector that is evenly divided into quadrants. Both types of quadrant light detector utilize a mask to occlude a fraction of the light incident on the device in relation to its direction.

To determine the direction to the source of light, the amount of light reaching each quadrant of the detector is measured. A calculation that utilizes the measurements will then provide the light source's direction. An example of such a calculation is given by Ramer et al. The accuracy of the calculation will depend on the accuracy of the measurements. In turn, the measurement accuracy is limited by the intensity of the light signal reaching the light detectors and the noise level of the measurement circuitry, and is dependent on their ratio (SNR). However, in certain directions, some quadrants of the detector may receive only 1% or less of the light received if fully illuminated.

In operation, the measurement of direction is typically used to locate a source, an object, multiple objects, or the Quadrant Detector itself within a volume of space. For example, a single QHD would provide direction to an object, while two or more QHD's would provide an object's position through triangulation. Thus, the measurement accuracy would then limit the accuracy to which the location of the object could be known. Due to increased occlusion for extreme angles, this accuracy degrades as the signal strength decreases. In many applications, such as metrology, guidance, motion control, collision avoidance, or targeting, performance is heavily dependent on the measurement accuracy, such that for a specified performance level, a particular level of measurement accuracy is required. If the required level of measurement accuracy cannot be achieved, then the deployment of Quadrant Light Detector is not practical.

Nevertheless, the measurement accuracy of a Quadrant Light Detector can be improved by increasing the SNR of the measurement system. This can be accomplished either by increasing the amount of light signal received by the Quadrant Light Detector or reducing the noise present in the measurement circuit or both.

Typical light sources that are readily available include a light emitting diode (LED) or Laser diode. These sources can be modulated or pulsed to work in conjunction with electronic filter circuitry. The filter serves to reduce the effect of ambient light that appears as noise in the optical signal as well as electronic noise in the circuitry itself. An LED provides a small amount of optical power which when radiated into a large solid angle (a large angular region of space) severely limits the range at which a sufficient light signal is received by a typical Quadrant Detector.

A laser, by its principle of operation, produces a tightly collimated beam that radiates into an extremely small solid angle (a small angular region of space). The more intense collimated beam of the laser, or the beam from an LED with a collimating lens, could be scanned through a large solid angle to compensate for the small angle subtended by the beam. The more intense beam increases the signal received by the QHD. An array of collimated lasers or LEDs can also be constructed to partially illuminate a large solid angle. However, both a scanning system and an array are undesirable due to increased cost, mechanical complexity, and size. The scanning system suffers from a reduced response time since for the majority of time, the beam is not directed toward an object. The array suffers from an incomplete coverage of the detection volume. These same limitations are also present in the case of an LED or laser utilized as a source located in the detection volume and illuminating the Quadrant Detector directly.

Furthermore, since many applications impose both a required measurement accuracy and a minimum range of operation, LED and laser sources are limited. Namely, typical range of operations with scanned LED or laser sources are less than 10 meters and less than 1 meter with LED sources without a lens. This range is not sufficient for many applications in collision avoidance, guidance, motion control, targeting, and object detection. Thus, the result being that neither an LED nor a laser is desirable as a source for use in an accurate measurement apparatus that requires a sufficient range.

To illustrate, the QHD is sensitive to light that emanates from a roughly hemispherical volume of space that lies in front of the detector. This light either can be produced directly from a source located in the volume or could be reflected from an object located in the volume. The size of the volume wherein accurate measurements can be obtained will be determined by the range at which a sufficient optical signal is received to produce the required SNR. Typically, a fixed amount of noise will be present in the circuitry of the apparatus. When the light source is located inside the volume, it must emit a sufficient quantity of light in a direction toward the detector in order to produce a signal large enough to be accurately detected. The source must then radiate into a large solid angle when the direction to the detector is not known or it is impractical to mechanically direct the source. A sufficient quantity of light must be reflected from an object back to the Quadrant Detector to accurately measure the direction to the object. Since the location of the object is not initially known, the source must radiate into the large solid angle in which the Quadrant detector is sensitive. In both cases, the source employed must radiate into a large solid angle and must have sufficient power to produce the SNR required by the application.

Additionally, a number of other methods can be employed to increase the optical signal that reaches any given detector. For example, the signal can be increased by making the detector larger. However, an increased Quadrant Detector size is not desirable as it reduces the speed of the system while increasing noise. A larger detector would also increase the cost of the system and result in a larger apparatus.

Alternatively, a lens can be employed to collect light from a large area and focus it onto a detector. However, the principle of the Quadrant Detector prevents the use of a lens, since a Quadrant Detector measures the direction light is traveling while a lens alters this direction.

Alternatively, the signal can be increased by reducing the distance between the source and detector. While this alternative approach will improve the measurement accuracy, the reduced distance will also reduce the volume within which the Quadrant detector can function, i.e., a reduced range of operation. Thus, these methods are also not practical in increasing the optical signal received by a Quadrant Detector.

Therefore, a need exists in the art for an apparatus and method that improves the measurement accuracy of a Quadrant Detector, where the light source or objects are located at greater distances.

SUMMARY OF THE INVENTION

The present invention is a method and apparatus for improving the accuracy of a region-based light detector by incorporating a strobe lamp as a light source. The present apparatus allows the directional measurement properties of a Quadrant Detector to be exploited in greater number of applications where measurement accuracy and/or greater range of operation are required.

The present invention is an apparatus for producing sufficient illumination into large solid angles and generating accurate measurements of the optical signals received by a Quadrant Detector from sources or objects located more than a few meters from the detector. More specifically, the invention comprises a strobe lamp with associated optical filters, shields, lenses, power supply, and encoding trigger circuitry, a strobe pulse timing detector with associated electronic circuitry, a Quadrant Detector with associated detection, amplification, filtering, sampling, and analog to digital conversion circuitry, and an electronic signal processing and control circuit with an associated output device.

In operation, either the electronic control circuit triggers the lamp encoding trigger circuitry or the lamp encoding trigger circuitry triggers itself by means of an internal circuit. The trigger circuit initializes one or a timed series of arcs within the strobe tube, having the capacity to transmit data via the light signals produced. The lamp's power supply circuitry stores energy to produce an extremely intense, short duration pulse of electric current through the gas contained in the strobe tube, resulting in an arc that produces an intense light. This light pulse is transmitted into a region of space determined by the shield and lenses associated with the lamp. An optical filter controls the wavelength band of the transmitted radiation to prevent interference with human vision or other undesired effects.

A Quadrant Detector responds to the light pulse or pulses that have traveled directly from the source or that have been reflected from an object. The path the light travels is determined by the application and controlled by the shielding. The light received by each quadrant of the quadrant detector is controlled by a mask that limits the light according to its direction of travel. The light entering each quadrant is detected by a photosensitive component that produces an electrical signal, which is a function of the light intensity. The light reaching the detector consists of light transmitted by the strobe lamp as well as ambient light.

An electronic circuit is associated with the detector. The circuit consists of a preamplifier, a gain controlled pulse amplifier and filter, a sample and hold circuit and an analog to digital converter for each of the detectors in the Quadrant Detector. The circuit amplifies the signal produced in the detectors by the brief, intense pulse from the strobe lamp while removing the relatively slowly varying portion of the signal produced by ambient light. The gain of the pulse amplifier is controlled to prevent saturation when a strong signal is present as occurs when an object is close to the detector. The level of gain is communicated to the signal processing circuit to scale the measurements. The strobe pulse timing circuit and discriminator detects the moment at which the radiation from the strobe is peaked. The pulse timing circuit discriminator determines if the magnitude of the pulse is sufficient for accurate measurement. If so, the pulse timing circuit then initiates the sampling of the received signal, when gated by the electronic control circuit, by triggering the sample and hold circuitry. The pulse timing circuit output is also directed to the electronic control circuit.

The electronic control circuit upon receipt of the peak timing signal initiates the analog to digital conversion circuitry. The electronic control circuit reads the result of the analog to digital conversions after such conversions are completed. The results are processed by a calculation that results in a direction to the received light expressed as a pair of angles in a spherical coordinate system. The control circuit transmits the results to an external device via the output device. The direct measurements could also be transmitted, without calculation of direction, for further processing by an external device.

The process of reception of light pulses may be repeated in a timed manner in order to decode a data transmission. Reception of multiple pulses with a predetermined timed sequence could be used as a means to distinguish a transmitted pulse train from the random pulse train produced by another bright arc source such as those produced during arc welding.

The intensity of the light pulse from the strobe lamp and the brevity of the pulse when combined with the pulse amplification, filtering, and timed sampling result in a measurement apparatus with the capability of improved accuracy when the strobe lamp or objects are located at large distances.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
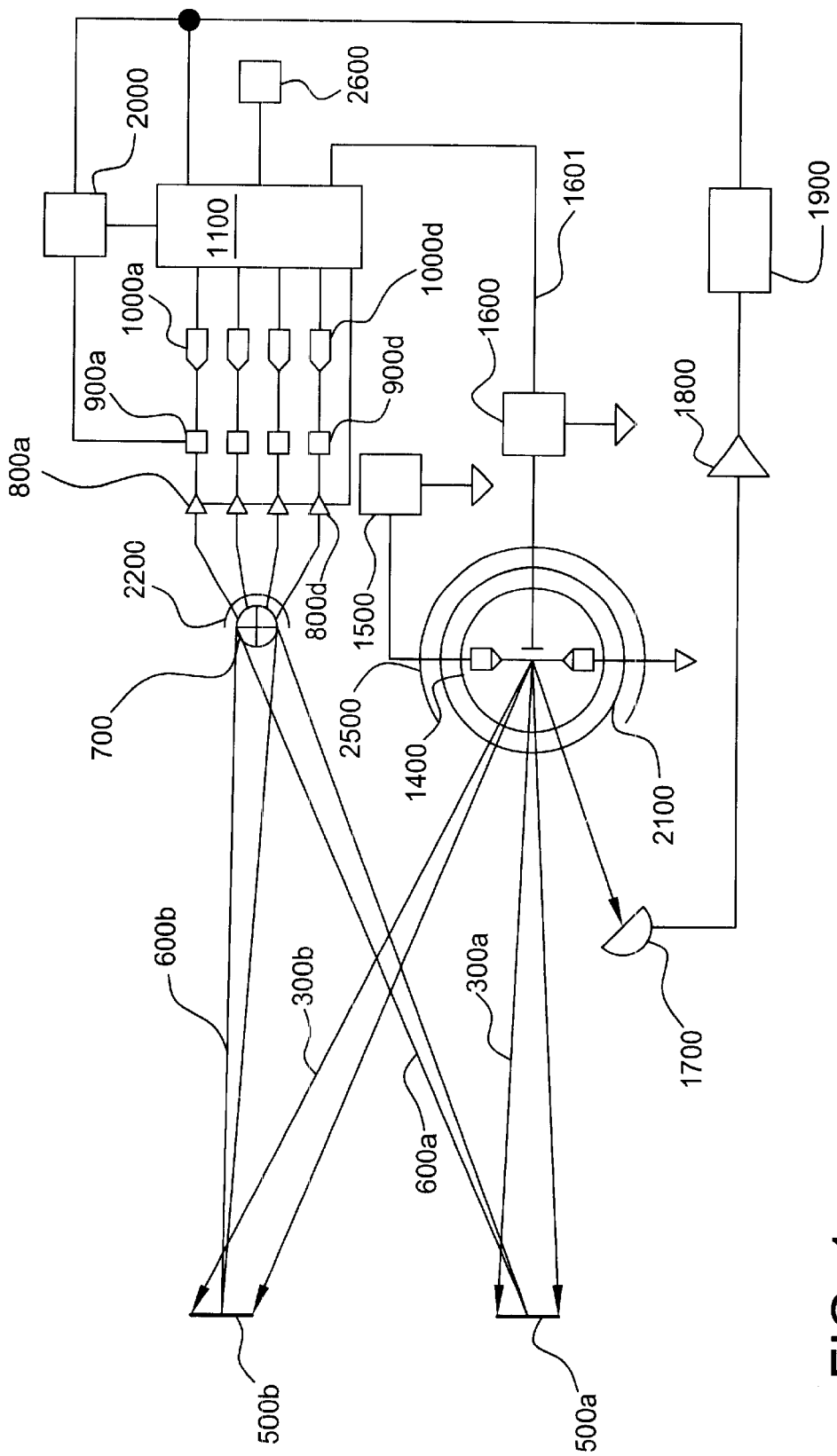
FIG. 1 depicts a block diagram of the apparatus of the present invention.

FIG. 1 depicts a block diagram of the preferred embodiment of an apparatus to improve the accuracy of measurements made with a Quadrant detector. A strobe lamp 1400 is employed to produce an intense pulse of light (300a and 300b are representative of portions of this pulse of light) that is projected into a large solid angle some of which reaches to a target or multiple targets 500a and 500b. The spectral content of the projected light is controlled by the optical filter 2100. The direction into which the light is projected is controlled by the optical/electrical shield 2500. The shield 2500 also serves to reduce the amount of electrical interference radiated by the arc within the strobe tube 1400. The direction that the light is radiated can be further controlled by a lens or series of lens (not shown). The strobe lamp 1400 is powered by energy stored in a lamp power supply 1500. Trigger and encoder circuit 1600 produces a high voltage pulse that initiates an electrical arc within the gas contained within the lamp tube. A timed sequence of pulses can be produced for data transmission and noise rejection.

The lights 600a and 600b reflected from the target(s) 500a and 500b are received by Quadrant Detector 700. Light may also travel directly from the Strobe Lamp 1400 to the Quadrant Detector 700 without reflection if required in applications where the direction to the source itself is to be measured. The quadrant detector may also utilize a shield 2200 to prevent reception of light from undesired directions.

The electrical signals generated by the Quadrant Detector 700 in response to the detection of light signals, are amplified and filtered by the circuitry 800a–d. Four electrical signals are generated, i.e., each electrical signal corresponds to one quadrant of the Quadrant Detector 700. The amplification gain is controlled to prevent saturation from strong light signals that originate close to the Quadrant Detector. The gain level is transmitted to the signal processing circuitry (signal processor) 1100 to scale the measurements. The amplification circuitry 800a–d consists of a preamplifier to convert the current signals from the photodetectors to a voltage. A set of pulse amplifier circuits with a variety of gains. A high speed switching circuit to connect the pulse amplifier with the appropriate gain for the signal strength to the sample and hold circuit. In addition, a multiple level comparator circuit to control the switch and indicate to the signal processing circuit 1100 which gain is in use for scaling the results of the measurement.

A Strobe Pulse Photodetector 1700 receives light produced by the Strobe Lamp 1400. The electronic signal from the Photodetector 1700 is filtered and amplified by a circuit 1800 and passed to a peak detector and discriminator circuit 1900. When the light pulse from the strobe tube 1400 peaks, the peak detector 1900 triggers the Sampling Circuitry 900a–d that samples the amplified and filtered signals from each quadrant of the quadrant detector 700. The peak detector can discriminate the amplitude of the received pulse and will only respond if the pulse is of sufficient amplitude for accurate measurement. The trigger signal from the peak detector 1900 is gated by gating section 2000 which is controlled by the signal processor 1100 in order to allow for rejection of spurious responses due to noise. The peak detector 1900 also signals the signal processing circuitry 1100 that the trigger signal from the peak detector has occurred.

The signal processing circuitry initiates analog to digital converters 1000a–d and acquires the results. The results of the measurements are processed mathematically to determine the direction to the object or source or they are output directly via the output circuitry 2600.

The process can be initiated either by the signal processing circuitry 1100 in applications where an electrical connection exists from the signal processing circuitry 1100 to the lamp trigger and encoder circuit 1600 or by the trigger and encoder circuit 1600 directly. The triggering by the trigger circuit 1600 directly would generally be used where the strobe tube 1400 and its power supply 1500 and trigger and encoder circuits 1600 are separated from the apparatus. The encoder circuit controls the number and timing sequence of light pulses produced by the strobe. Timed sequences of pulses enable the transmission of data or assist in the determination of the origin of the light received.

Figure 2:
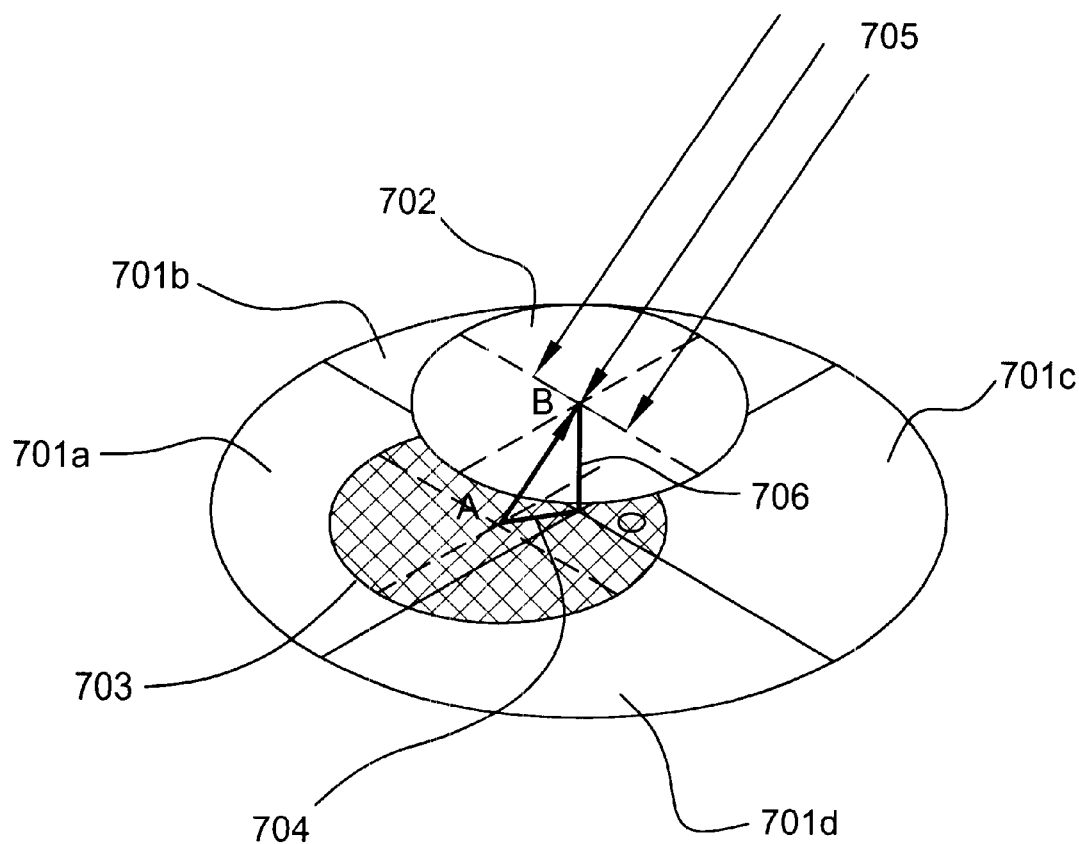
FIG. 2 illustrates the function of an illuminated Quadrant Detector.

FIG. 2 illustrates the principle of the Quadrant Detector 700. The quadrant detector 700 is comprised of four (4) photosensitive regions 701a–d. The regions in this case are circular but other shapes could be employed. In fact, the quadrant detector 700 may comprise any number of regions.

A mask 702 is positioned above the photosensitive regions in a plane parallel with the photosensitive regions (detectors). The center of the mask ideally lies on a line normal to the detectors and originates from their center, as illustrated by line O–B 706. In practice, the center of mask 702 may vary from the ideal position and line O–B may not be normal to the surface of the detectors.

In operation, light is incident on the Quadrant Detector. A portion of the light is illustrated by 705 to show the reader the direction the light is traveling. Actually, the entire Quadrant Detector is bathed in light traveling parallel to the light shown in the illustration. The incident light produces a shadow 703, since the mask 702 occludes a portion of the incident light 705. The center of the shadow being located at point A. A vector A–B drawn from point A through point B points in a direction toward the source of light 705. In practice, the location of point B relative to point O can be physically measured. Measurements being made relative to a coordinate system formed by the edges of quadrants 701a–d and a line normal to the plane of the detectors and passing through point O. The vector A–B is then determined by the location of point A. Point A's location can be described in a polar coordinate system with origin at point O and angle measured relative to an edge of one quadrant. The location of point A can be determined by measurement of the amount of light reaching Quadrants 701a–d and comparison of the ratio of each measurement to the total light received by all quadrants if the shadow falls on all quadrants. One method of such computation is described by Ramer et al.

Namely, a system of mathematical relationships describe the location of point A as a function of the measured light intensity in each quadrant 701a–d in general, where the shadow falls on three, two, or one quadrant as the center of the shadow moves further from point O. The method used to determine which relationship is in effect, is based on the maximum light intensity recorded in the four quadrants.

Figure 3:
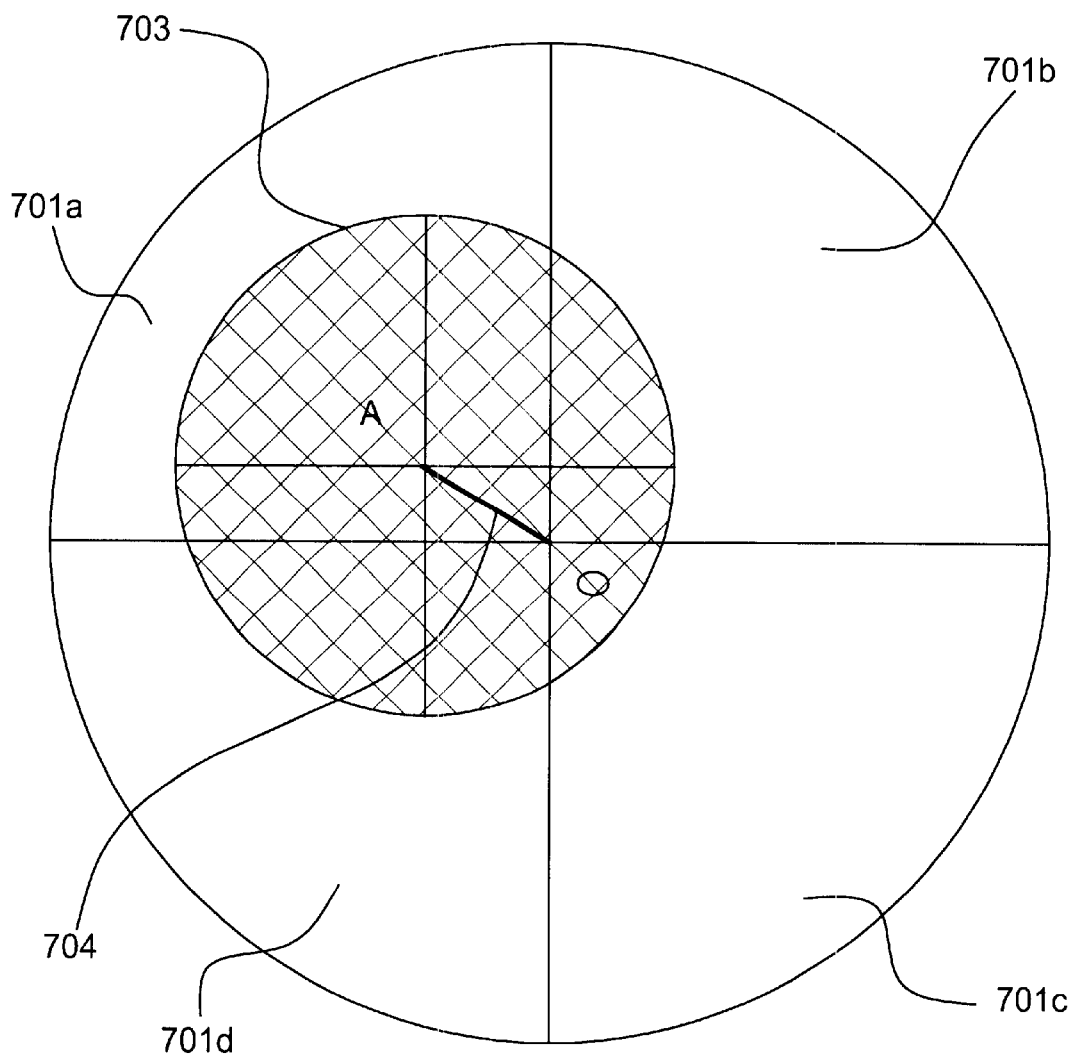
FIG. 3 illustrates an optical signal on a Quadrant Detector.

FIG. 3 illustrates the shadow 703 of mask 702 on the four photosensitive regions 701a–d and the vector O–A 704 drawn to its center. It should be noted that there is a location of point A where a Quadrant 701a–d would be almost fully covered by shadow 703. The signal would then be at its lowest point in that quadrant. Noise in the measurement apparatus would have its greatest effect on accuracy when this occurs. The accuracy is a function of the location of point A, for a given level of noise in the apparatus. Thus, it is advantageous to have the brightest source possible in order to maintain accuracy over the maximum range of direction to the source.

Figure 8:
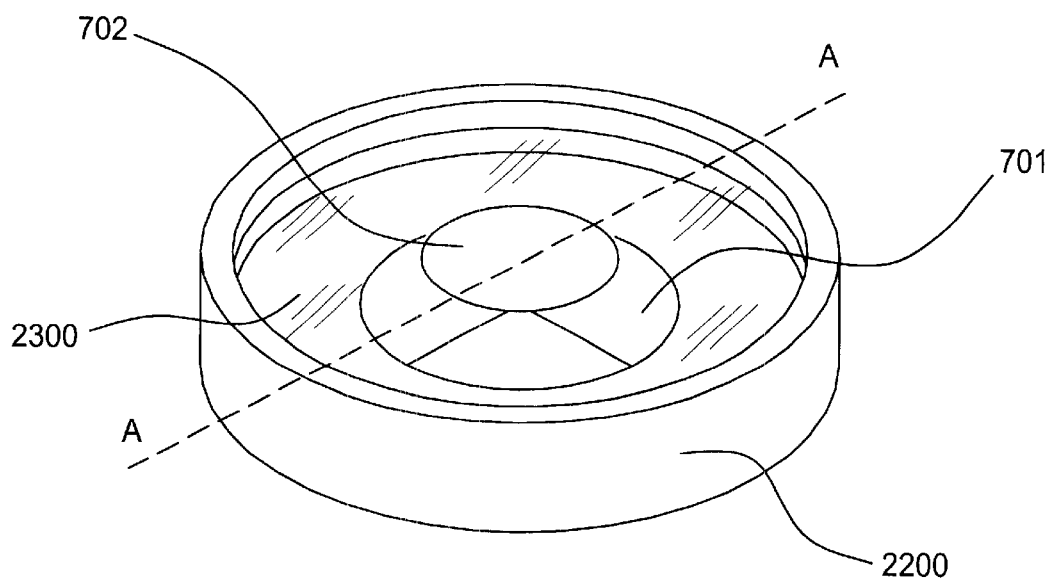
FIG. 8 illustrates a perspective view of a Masked Quadrant Detector.

FIG. 8 illustrates the construction of a Masked Quadrant Detector. A multi-element silicon photodiode 701, e.g., from Hamamatsu (Part number S4521) provides 4 photosensitive regions. While a silicon photodiode is provided as an example, other types of photosensors could be employed, including but not limited to, avalanche photodiodes, photomultiplier tubes, photodiodes constructed of materials other than silicon such as Indium Gallium Arsenide and the like. In fact, any type of photosensors that can be suitably shaped could be substituted for the silicon photodiodes described.

More specifically, mask 702 is affixed to window 2300 that serves to support and position the mask in the assembly. Shield 2200 serves a dual purpose as a rigid housing to enclose the Quadrant detector and as a shield to limit the angle that light can enter the device. The shield could prevent stray light from ruining a measurement or could allow a simplification of the processing by preventing a shadow from forming that is located beyond a limiting radius from point O in FIG. 3.

Figure 5:
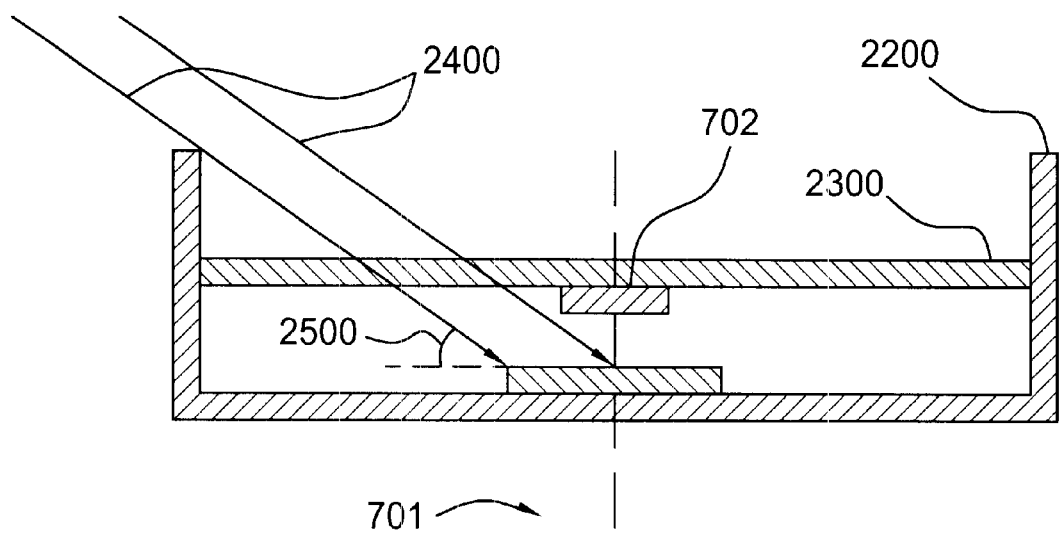
FIG. 5 illustrates a cross section along the line A—A in FIG. 8.

FIG. 5 is a sectional view of the Masked Quadrant detector of FIG. 8 along the line A—A. Light 2400 is incident at the maximum angle 2500 before shield 2200 begins to cut off the incident light.

Figure 6:
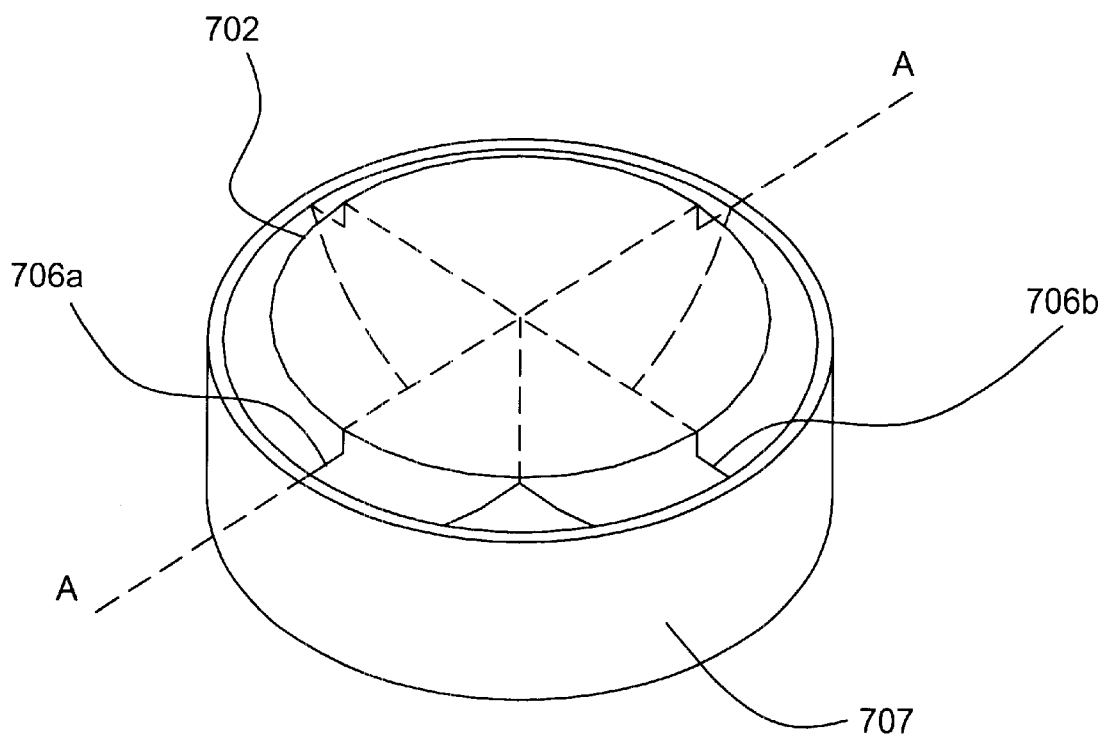
FIG. 6 illustrates a perspective view of a QHD type Quadrant Detector.

FIG. 6 is a perspective view of an illustrative Quadrant Light Detector as described in U.S. Pat. No. 5,705,804 by Ramer et al. The four photosensitive regions are formed by apertures between the hemispherical cavity 707, the mask 702, and two baffles 706a–b.

Figure 7:
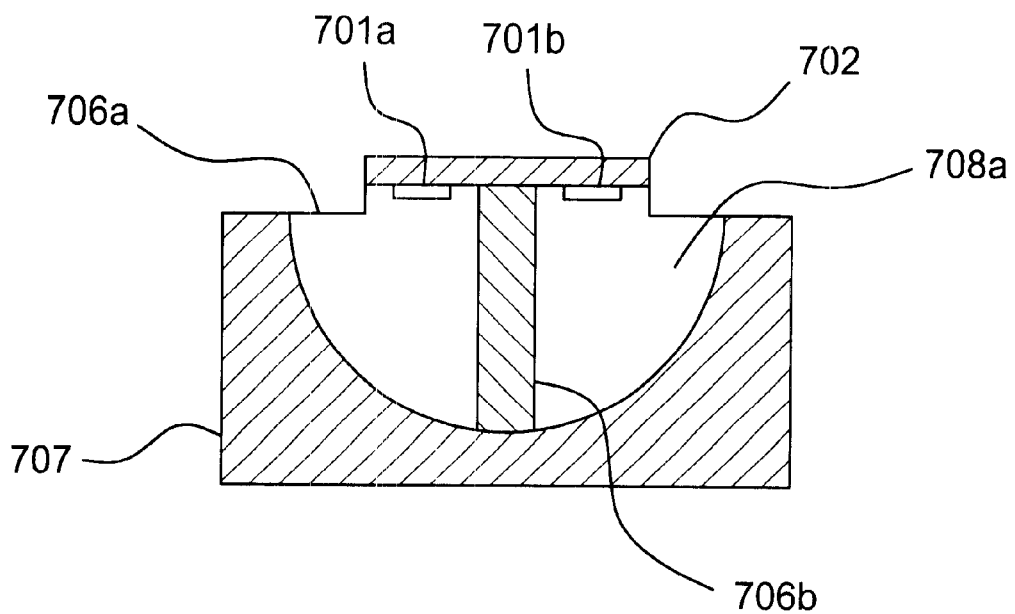
FIG. 7 illustrates a cross sectional view along the line A—A in FIG. 6.

FIG. 7 depicts a cross section of the Quadrant light detector of FIG. 6 along the line A—A. Light enters the hemispherical quadrants 708a–d and is reflected within the cavity formed by the walls of the hemispherical cavity 707, the surface of the baffles 706a–b, and the bottom of mask 702. A portion of the light entering the cavity eventually reaches the photosensitive regions 701a–d. A description of the detailed function of the device is given by Ramer et al.

While the response of the Quadrant Light Detector (QLD) of FIG. 6 differs from the Masked Quadrant Detector of FIG. 8, an apparatus for measuring the direction to a light source could be constructed from either. More importantly, the operating range and accuracy of both Quadrant Detectors can be greatly improved when deployed with a strobe lamp in the present invention.

The Quadrant Light Detector having a wider response angle extending nearly to the horizon. Since the QLD uses the principle of occlusion and therefore causes a reduction in the light received by the photosensors 701a–d, as a function of the angle of the incident light, it too benefits from a bright source of light to improve the accuracy of its measurements. The two types of detectors can be interchangeable in the present apparatus, but a different method is required to determine the direction to the light source. In fact, there are a multitude of arrangements of photosensitive regions and masks of various sizes and shapes which use the principle of occlusion to determine direction to a source that could be used in the apparatus of this invention and benefit in accuracy from its advantages.

Figure 4:
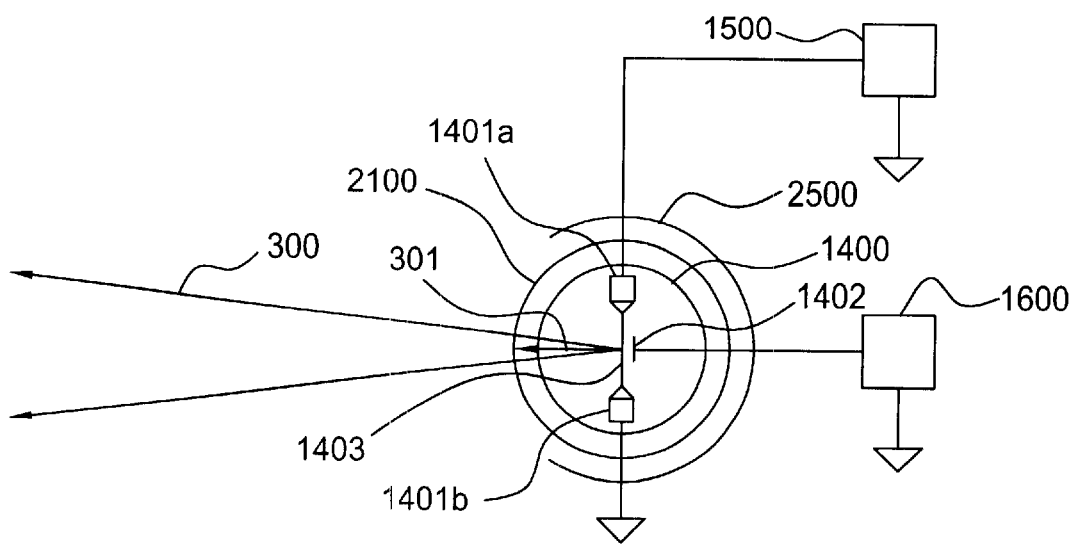
FIG. 4 depicts a block diagram of the strobe portion of the apparatus.

FIG. 4 depicts a schematic diagram of a strobe lamp pulsed light source. A strobe lamp 1400 is comprised of a glass envelope with a gas mixture of a specific composition and pressure contained within the envelope. A set of arc electrodes 1401a–b are positioned within the gas. A trigger electrode or a multitude of trigger electrodes is located within the gas mixture as well. In addition, a filter 2100, a shield 2500, and even a system of lenses (not shown) can be fitted around the lamp 1400.

A lamp power supply circuit 1500 converts electrical energy from a power source to required voltage levels and stores this energy in a capacitive circuit. A trigger circuit 1600 produces a sequence of high voltage pulses which when applied to the trigger electrode 1402 initiate a sequence of electrical arc discharges through the gas within the lamp. Each arc discharge produces an extremely bright pulse of light as a result of the gas composition, pressure, and the extreme temperatures reached within the arc discharge.

The produced light pulse 300 passes through the glass envelope, shield, filter, and lens (if present) and proceeds into space. A portion of the light 301 may be stopped by the filter or shield to prevent spurious responses in the apparatus due to stray light or undesired effects such as temporary blindness were a person to be exposed to the light pulse. The filter 2100 and shield 2500 also serve to protect individuals by directing the light into a safe location or by filtering out harmful portions of the emitted spectrum. In fact, additional safety devices could be employed such as interlock switches or external sensors to prevent the lamp from pulsing in the event that a breech of safety is detected.

The produced light pulse 300 when the lamp is pulsed, can travel into a large angular region of space, as the arc can be conceived as a point source of light. The intensity of the pulse can range from a few kilowatts to several hundred kilowatts and its duration can range from less than a microsecond to a few milliseconds. There are varieties of strobe lamps commercially available from which a lamp can be selected for use in the apparatus to provide desirable characteristics for a particular application.

For example, a strobe lamp manufactured by Hamamatsu Photonics K.K. (part number L4641) can provide a repetition rate of 100 Hertz with a life rating of greater than 1 billion pulses. Such a strobe lamp is suitable for a system that requires a short response time and low lamp replacement maintenance.

Similarly, strobe tube manufactured by Heimann (part number DG99300) can provide a life rating of 5 million flashes at a maximum repetition rate of 10 flashes per second but it produces over 100 kilowatts of optical power. This lamp is suitable for distances greater than 50 meters for a target of sufficient size.

In fact, any strobe tube or lamp can be substituted for the examples cited with a corresponding change in the lamp power supply 1500 and trigger circuit 1600 to tailor the apparatus for a particular application.

In contrast, the optical power available from an LED is typically around a maximum of 1 watt. The optical power received by the quadrant detector from light reflected by a diffuse reflective object diminishes in proportion to the inverse of the distance raised to the fourth power. The range which can be expected is therefore up to 50 times greater than what can be achieved with an LED and can be increased further still with lenses or if more powerful strobe lamps are employed. The strobe lamp is clearly more suitable as a source for accurate measurements when distances are large.

Similarly, while lasers are commonly perceived as the brightest source available, their coherent characteristics and collimated beam do not lend themselves to this invention. The large power levels required would be impractical, as such power level would result in dangerous and destructive capabilities resulting from the coherent radiation. The collimated beam would need to be scanned in order to cover a large solid angle and would increase the complexity and cost of the apparatus as would the laser source and its modulating circuitry.

Another advantage of the present region-based detecting system having a strobe tube, is the short duration of the light pulse that is produced. Pulse amplification circuitry is simple to construct and effective at filtering out the typical optical noise signals produced by artificial and natural sources that would effect the accuracy of the measurements. The extremely high rate of change in light intensity reaching the Quadrant detector lends itself to the construction of effective filters and simple amplifiers to detect it.

Such construction is employed in this invention as to take full advantage of these beneficial characteristics of strobe lamp sources that when combined with quadrant detectors and electronic circuitry described herein improve the accuracy of angular measurements of the direction to a light source made by the apparatus.

Although various embodiments which incorporate the teachings of the present invention have been shown and described in detail herein, those skilled in the art can readily devise many other varied embodiments that still incorporate these teachings.

What is claimed is:

1. A detection apparatus comprising:
   a strobe lamp for emitting a high intensity beam of light, where said high intensity beam of light is reflected from a target; and
   a region-based detector for receiving a portion of said reflected high intensity beam of light.

2. The detection apparatus of claim 1, wherein said region-based detector is a quadrant light detector (QLD).

3. The detection apparatus of claim 2, wherein said quadrant light detector is a quad hemispherical detector (QHD).

4. The detection apparatus of claim 2, wherein said quadrant light detector is a masked quadrant detector.

5. The detection apparatus of claim 2, further comprising a signal processor for receiving a plurality of electrical signals from said region-based detector, where processor processes said plurality of electrical signals to produce information associated with said high intensity beam of light of said strobe lamp.

6. The detection apparatus of claim 5, wherein said information associated with said high intensity beam of light relates to a location of said high intensity beam of light.

7. The detection apparatus of claim 1, wherein said region-based detector is positioned greater then ten meters from said strobe lamp.

8. The detection apparatus of claim 5, further comprising a signal amplifier, disposed between said region-based detector and said signal processor, for amplifying said plurality of electrical signals from said region-based detector.

9. The detection apparatus of claim 8, wherein said signal amplifier is a pulse amplification circuit.

10. The detection apparatus of claim 8, further comprising a filter, disposed between said region-based detector and said signal amplifier, for filtering said plurality of electrical signals from said region-based detector prior to the application of amplification.

11. The detection apparatus of claim 1, further comprising a trigger circuit, coupled to said strobe lamp, for triggering said strobe lamp.

12. The detection apparatus of claim 11, further comprising a storage circuit, coupled to said strobe lamp, for storing sufficient energy to charge said strobe lamp.

13. The detection apparatus of claim 5, further comprising a peak detector, coupled to said signal processor, for providing information to said signal processor to begin processing in response to a firing of said strobe lamp.

14. The detection apparatus of claim 13, wherein said processing of said signal processor comprises a sampling of said electrical signals from said region-based detector.

15. A detection method comprising the steps of:
   (a) using a strobe lamp for emitting a high intensity beam of light, where said high intensity beam of light is reflected from a target; and
   (b) using a region-based detector for receiving a portion of said reflected high intensity beam of light.

16. The method of claim 15, wherein said region-based detector is a quadrant light detector (QLD).

17. The method of claim 15, further comprising the step of:
   (c) using a signal processor for receiving a plurality of electrical signals from said region-based detector, where said processor processes said plurality of electrical signals to produce information associated with said high intensity beam of light of said strobe lamp.

18. The method of claim 17, further comprising the step of:
   d) using a peak detector for providing information to said signal processor to begin processing in response to a firing of said strobe lamp.

19. The method of claim 15, wherein said information associated with said high intensity beam of light relates to a location of said high intensity beam of light.

20. The method of claim 15, wherein said region-based detector is positioned greater then ten meters from said strobe lamp.

\* \* \* \* \*

UNITED STATES PATENT AND TRADEMARK OFFICE
CERTIFICATE OF CORRECTION

PATENT NO. : 6,444,973 B1
DATED : September 3, 2002
INVENTOR(S) : James R. Disser It is certified that error appears in the above-identified patent and that said Letters Patent is hereby corrected as shown below:

<u>Title page,</u>
Item [76], please change "Dissey" to -- Disser --.

Signed and Sealed this

Fourth Day of January, 2003

JAMES E. ROGAN
*Director of the United States Patent and Trademark Office*